United States Patent
Souda

(10) Patent No.: US 9,894,813 B2
(45) Date of Patent: Feb. 13, 2018

(54) ELECTRIC APPARATUS PROVIDED WITH FRAME AND POWER SUPPLY

(71) Applicant: BROTHER KOGYO KABUSHIKI KAISHA, Nagoya-shi, Aichi-ken (JP)

(72) Inventor: Makoto Souda, Nagoya (JP)

(73) Assignee: BROTHER KOGYO KABUSHIKI KAISHA, Nagoya-Shi, Aichi-Ken (JP)

( * ) Notice: Subject to any disclaimer, the term of this patent is extended or adjusted under 35 U.S.C. 154(b) by 0 days.

(21) Appl. No.: 15/447,353

(22) Filed: Mar. 2, 2017

(65) Prior Publication Data

US 2017/0257985 A1 Sep. 7, 2017

(30) Foreign Application Priority Data

Mar. 3, 2016 (JP) .................. 2016-041433

(51) Int. Cl.
*G03G 15/00* (2006.01)
*H05K 7/20* (2006.01)
*H05K 7/14* (2006.01)

(52) U.S. Cl.
CPC ......... *H05K 7/20909* (2013.01); *G03G 15/80* (2013.01); *H05K 7/14* (2013.01)

(58) Field of Classification Search
CPC ....... G03G 15/80; H05K 7/14; H05K 7/20909
See application file for complete search history.

(56) References Cited

U.S. PATENT DOCUMENTS

| | | | |
|---|---|---|---|
| 6,928,251 B2 * | 8/2005 | Yoshihara | ................ B41J 29/02 347/152 |
| 2004/0095456 A1 | 5/2004 | Yoshihara et al. | |
| 2013/0136484 A1 * | 5/2013 | Takahashi | .......... G03G 21/1619 399/92 |
| 2013/0136485 A1 | 5/2013 | Takahashi | |

FOREIGN PATENT DOCUMENTS

| | | |
|---|---|---|
| JP | 2004-077788 A | 3/2004 |
| JP | 2013-188952 A | 9/2013 |

* cited by examiner

*Primary Examiner* — Hoang Ngo
(74) *Attorney, Agent, or Firm* — Merchant & Gould P.C.

(57) ABSTRACT

An electric apparatus includes a casing, a power supply, a frame, and a fan. The power supply is accommodated in the casing, and includes a power supply board and a power supply component mounted on a mounting surface of the power supply board. The frame is disposed outward of the power supply within the casing. The frame is formed with a through-hole extending therethrough, and has a first part and a second part. The first part is made from a flame retardant resin, and constitutes at least a part of the ambient portion surrounding the through-hole. The at least a part of the ambient portion is positioned at a side the same as the power supply component with respect to the mounting surface. At least a part of the second part is made from a material having flame retardancy lower than that of the flame retardant resin.

10 Claims, 10 Drawing Sheets

ELECTRIC APPARATUS PROVIDED WITH FRAME AND POWER SUPPLY

CROSS REFERENCE TO RELATED APPLICATION

This application claims priority from Japanese Patent Application No. 2016-041433 filed Mar. 3, 2016. The entire content of the priority application is incorporated herein by reference.

TECHNICAL FIELD

The present disclosure relates to an electric apparatus provided with a power supply for supplying power, and more particularly, to an image forming apparatus provided with a power supply for supplying power.

BACKGROUND

An image forming apparatus provided with a main body housing, an image forming portion accommodated in the main body housing, a power supply, and a main body frame serving as a wall portion is well known in the art. The power supply is disposed at one side of the image forming apparatus, and includes a power supply board, electronic components mounted on the power supply board, and a shield metal plate. The main body frame vertically extends and disposed between the shield metal plate and the image forming portion. The electronic components are disposed between the shield metal plate and the main body frame, and the power supply is supported to the main body frame.

The main body frame that supports the power supply is made entirely from a flame retardant resin material, and the power supply board on which the electronic components are mounted is entirely covered and protected by the shield metal plate and the main body frame.

SUMMARY

The main body frame that supports the power supply is made entirely from one kind of flame retardant resin material, which requires a large volume of the costly flame retardant material to be used, and this in turn leads to an increase in cost of the main body frame.

Therefore, in an electric apparatus provided with a frame and a power supply supported thereto, particularly in an image forming apparatus provided with a frame and a power supply supported thereto, a reduction in cost of the frame is required.

In order to attain the above and other objects, according to one aspect, the disclosure provides an electric apparatus including a casing, a power supply, a frame, and a fan. The power supply is accommodated in the casing, and includes a power supply board and a power supply component. The power supply board has a mounting surface. The power supply component is mounted on the mounting surface. The frame extends in a vertical direction and is disposed outward of the power supply within the casing. The frame is formed with a through-hole extending therethrough. The frame has a first part and a second part. The through-hole has one open end open to an inner surface of the casing and another open end open to the power supply. The through-hole faces the power supply component in a horizontal direction orthogonal to the vertical direction. The through-hole is surrounded by an ambient portion of the frame. The first part is made from a flame retardant resin, and constitutes at least a part of the ambient portion. The at least a part of the ambient portion is positioned at a side the same as the power supply component with respect to the mounting surface. At least a part of the second part is made from a material having flame retardancy lower than that of the flame retardant resin. The fan is configured to generate an airflow directed from the power supply to the through-hole.

According to another aspect, the disclosure provides an image forming apparatus including a casing, a power supply, a frame, a fan, and an image forming unit. The power supply is accommodated in the casing, and includes a power supply board and a power supply component. The power supply board has a mounting surface. The power supply component is mounted on the mounting surface. The frame extends in a vertical direction and is disposed outward of the power supply within the casing. The frame is formed with a through-hole extending therethrough. The frame has a first part and a second part. The through-hole has one open end open to an inner surface of the casing and another open end open to the power supply. The through-hole faces the power supply component in a horizontal direction orthogonal to the vertical direction. The through-hole is surrounded by an ambient portion of the frame. The first part is made from a flame retardant resin and constitutes at least a part of the ambient portion. The at least a part of the ambient portion is positioned at a side the same as the power supply component with respect to the mounting surface. At least a part of the second part is made from a material having flame retardancy lower than that of the flame retardant resin. The fan is configured to generate an airflow directed from the power supply to the through-hole. The image forming unit is accommodated in the casing, and is disposed at a side the same as the power supply with respect to the frame.

BRIEF DESCRIPTION OF THE DRAWINGS

The particular features and advantages of the disclosure will become apparent from the following description taken in connection with the accompanying drawings, in which.

DETAILED DESCRIPTION

An image forming apparatus 1 according to an embodiment will be described with reference to the accompanying drawings.

<Overall Structure of Image Forming Apparatus>

Figure 1:
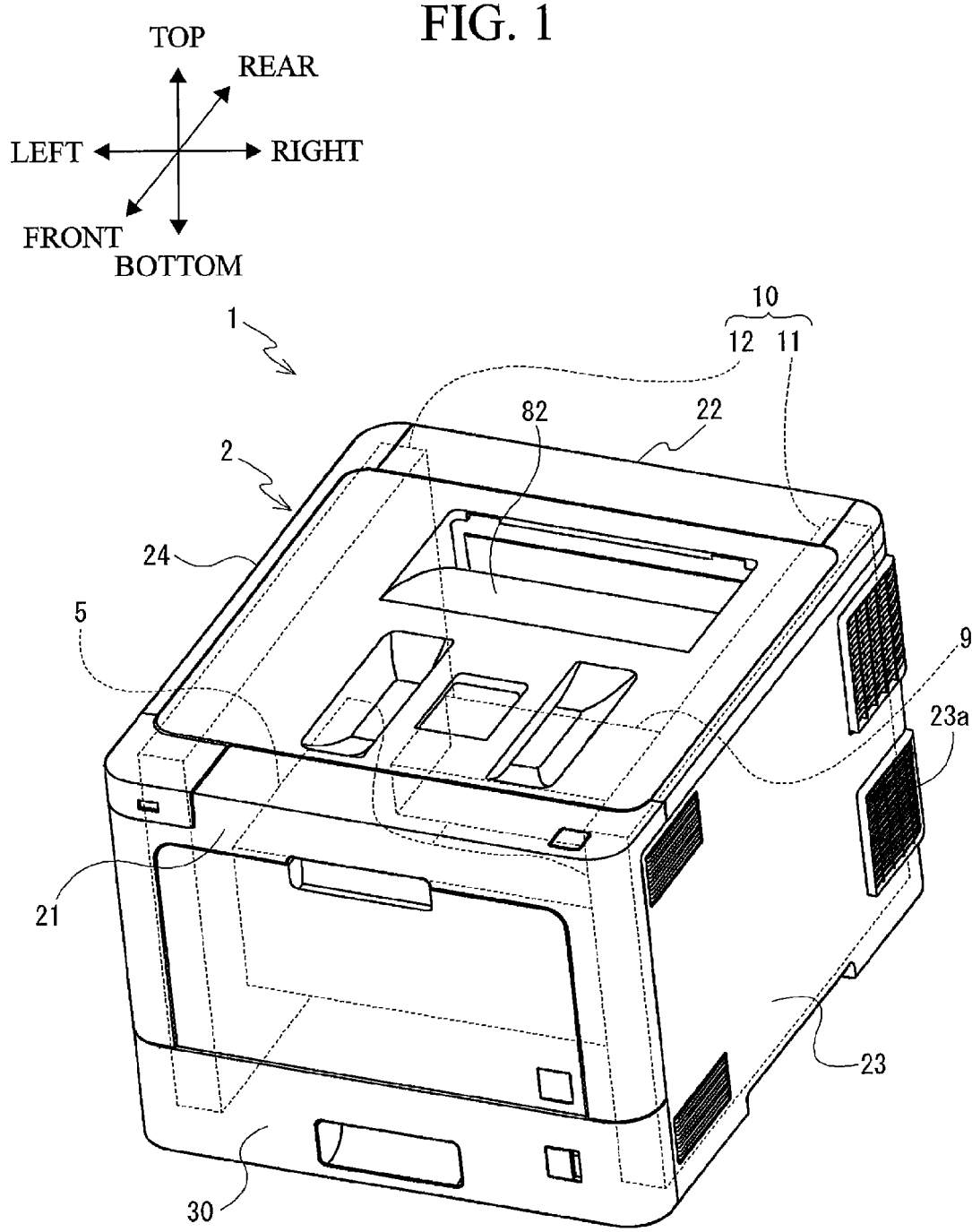
FIG. 1 is a perspective view of an image forming apparatus according to an embodiment.
Figure 2:
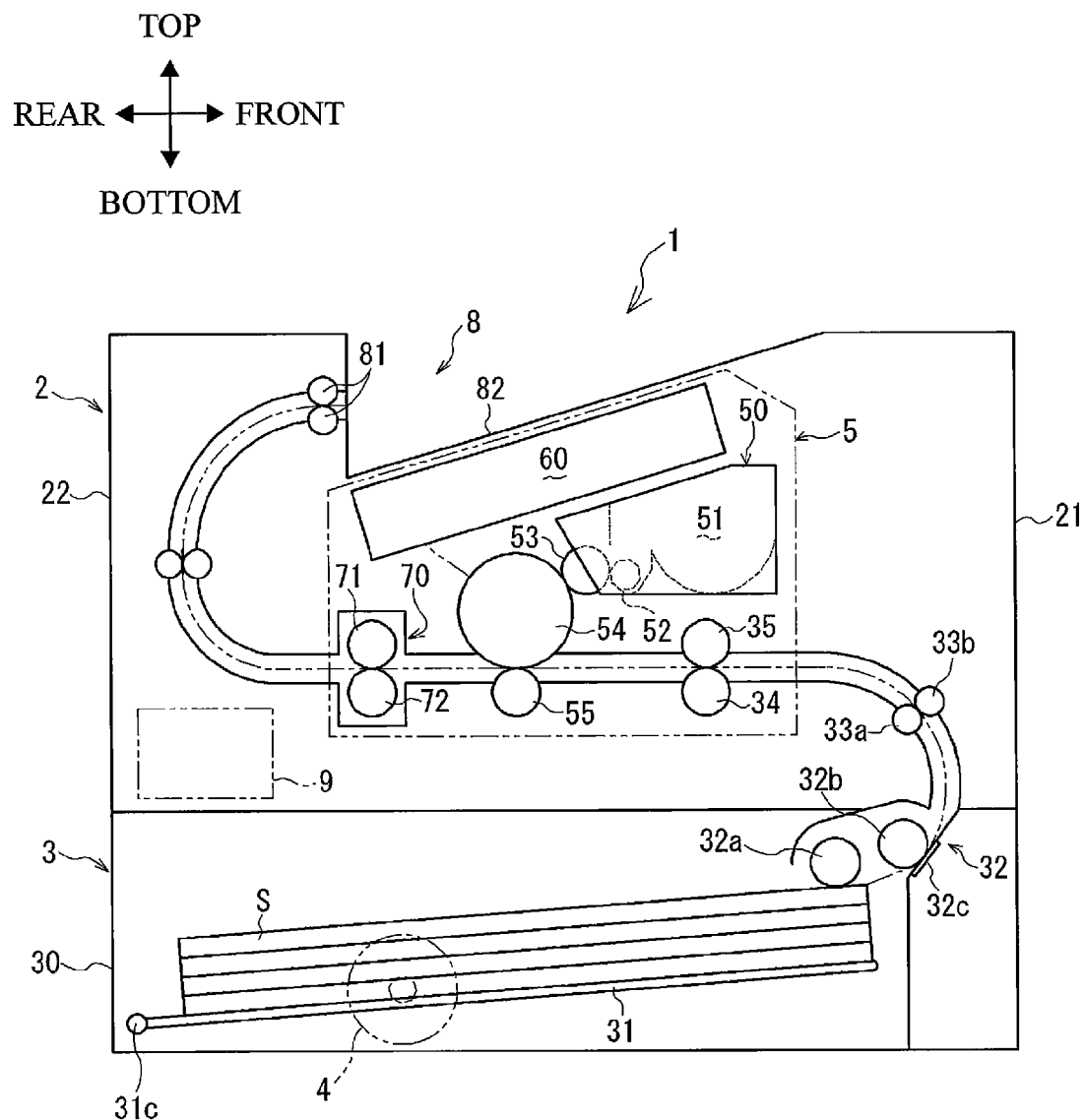
FIG. 2 is a cross-sectional view of the image forming apparatus according to the embodiment, the cross-sectional view being taken along a plane orthogonal to a leftward/rightward direction.

As illustrated in FIGS. 1 and 2, the image forming apparatus 1 includes a casing 2, a sheet supply unit 3, an image forming unit 5, a discharge unit 8, a motor 4 serving as a drive source for supplying drive force, and a power supply 9 that supplies electric power to the motor 4 and the image forming unit 5. the image forming apparatus 1 is an example of the claimed "an electric apparatus."

The sheet supply unit 3 is disposed at a lower portion of the image forming apparatus 1. The sheet supply unit 3 is configured to convey a sheet S placed therein to the image forming unit 5. The image forming unit 5 is positioned downstream of the sheet supply unit 3 in a conveying direction of the sheet S. The image forming unit 5 is configured to form an image on the sheet S supplied from the sheet supply unit 3. The discharge unit 8 is disposed downstream of the image forming unit 5 in the conveying direction of the sheet S. The discharge unit 8 is configured to discharge the sheet S on which an image has been formed by the image forming unit 5 to an outside of the image forming apparatus 1.

The sheet supply unit 3 includes a sheet cassette 30, a sheet feeding mechanism 32, a conveying roller 33a, and a registration roller 34.

The sheet cassette 30 is detachably attached to the lower portion of the casing 2. The sheet cassette 30 is movable between an attached position at which the sheet cassette 30 is attached to the casing 2 and a detached position at which the sheet cassette 30 is detached from or pulled out of the casing 2.

In the following description, the pulled-out direction of the sheet cassette 30 (i.e. the direction in which the sheet cassette 30 at the attached position is pulled out of the casing 2) is defined as a forward direction with respect to the image forming apparatus 1, while the attaching direction of the sheet cassette 30 (i.e. the direction in which the sheet cassette 30 at the detached position is attached to the casing 2) is defined as a rearward direction with respect to the image forming apparatus 1.

The sheet cassette 30 has a lifter plate 31 on which the sheets S are stacked. The lifter plate 31 has a pivot shaft 31c, and is pivotally movable in a vertical direction (i.e. the upward/downward direction) about the pivot shaft 31c by the drive force from the motor 4. By pivotal movement of the lifer plate 31, the sheets S placed on the lifer plate 31 can be moved upward and downward. Hence, the sheets S placed on the lifter plate 31 moves upward as the lifter plate 31 pivotally moves upward, so that the sheets S can be moved to a sheet feeding position. The sheet feeding position is a position at which the sheets S can be fed.

The sheet feeding mechanism 32 is configured to separate each one of the sheets S from the remaining sheets S placed on the sheet cassette 30, and to convey the each separated sheet S toward the conveying roller 33a. The sheet feeding mechanism 32 includes a pick-up roller 32a, a separation roller 32b, and a separation pad 32c.

The pick-up roller 32a is a roller configured to pick-up the sheets S lifted up to the sheet feeding position by the lifter plate 31. The pick-up roller 32a is positioned above a front end portion of the lifter plate 31.

The separation roller 32b is positioned downstream of the pick-up roller 32a in the conveying direction of the sheet S. The separation pad 32c is disposed in confrontation with the separation roller 32b and urged toward the separation roller 32b.

The sheets S picked-up by the pick-up roller 32a are conveyed toward the separation roller 32b. The separation roller 32b separates each one of the sheets S from the remaining sheets S in cooperation with the separation pad 32c at a position between the separation roller 32b and the separation pad 32c. The separated sheet S is conveyed toward the conveying roller 33a.

The conveying roller 33a is configured to impart a conveying force to the sheet S. The conveying roller 33a is positioned downstream of the sheet feeding mechanism 32 in the conveying direction. A paper-dust removing roller 33b is disposed in confrontation with the conveying roller 33a. The sheet S conveyed toward the conveying roller 33a from the sheet feeding mechanism 32 is nipped between the conveying roller 33a and the paper-dust removing roller 33b, and is further conveyed toward the registration roller 34.

The registration roller 34 is positioned downstream of the conveying roller 33a in the conveying direction of the sheet S. An opposing roller 35 is disposed in confrontation with the registration roller 34. The registration roller 34 regulates and temporarily stops movement of a leading edge of the conveyed sheet S in cooperation with the opposing roller 35, and then conveys the sheet S toward an image transfer position at a prescribed timing.

The image forming unit 5 includes a process cartridge 50, an exposure unit 60, and a fixing unit 70. The process cartridge 50 is configured to transfer an image onto a surface of the sheet S conveyed from the sheet supply unit 3. The exposure unit 60 is configured to expose a surface of a photosensitive drum 54 of the process cartridge 50 to light. The fixing unit 70 is configured to fix the transferred image onto the sheet S.

The process cartridge 50 is positioned within the casing 2 at a position above the sheet supply unit 3. The process cartridge 50 includes a developer chamber 51, a supply roller 52, a developing roller 53, the photosensitive drum 54, and a transfer roller 55.

The exposure unit 60 includes a laser diode, a polygon mirror, lenses, and reflection mirrors. The exposure unit 60 is configured to emit a laser beam toward the photosensitive drum 54 to expose the surface thereof to light on the basis of image data inputted into the image forming apparatus 1.

The developer chamber 51 accommodates therein toner as developer. The toner accommodated in the developer chamber 51 is supplied to the supply roller 52 while agitated by an agitation member (not illustrated). The supply roller 52 is configured to supply the toner supplied from the developer chamber 51 to the developing roller 53.

The developing roller 53 is disposed in contact with the supply roller 52. The developing roller 53 is configured to carry the toner supplied from the supply roller 52. A friction member (not illustrated) is provided for charging the toner carried on the developing roller 53 with positive polarity. The developing roller 53 is applied with a developing bias having positive polarity by a bias application unit (not illustrated).

The photosensitive drum 54 is positioned adjacent to the developing roller 53. The surface of the photosensitive drum 54 is exposed to light by the exposure unit 60 after the surface of the photosensitive drum 54 is uniformly charged with positive polarity by a charger (not illustrated). The exposed region of the photosensitive drum 54 has an electric potential lower than that of the non-exposed region. Thus, an electrostatic latent image based on image data is formed on the photosensitive drum 54.

Then, the positively charged toner is supplied to the surface of the photosensitive drum 54 from the developing roller 53, so that the electrostatic latent image formed on the photosensitive drum 54 becomes a visible developer image.

The transfer roller 55 is disposed in confrontation with the photosensitive drum 54. The transfer roller 55 is applied with a transfer bias having negative polarity by the bias application unit (not illustrated). The developer image formed on the surface of the photosensitive drum 54 is transferred onto the surface of the sheet S when the sheet S is nipped and conveyed through the image transfer position between the photosensitive drum 54 and the transfer roller 55 while the transfer bias is applied to the surface of the transfer roller 55.

The fixing unit 70 includes a heating roller 71 and a pressure roller 72. The heating roller 71 is rotationally driven by the drive force from the motor 4 and heated by electric power supplied from the power supply 9. The pressure roller 72 is disposed in confrontation with the heating roller 71. The pressure roller 72 is in contact with the heating roller 71 and rotates following the rotation of the heating roller 71. When the sheet S onto which the developer image transferred is conveyed toward the fixing unit 70, the conveyed sheet S is nipped and conveyed between the heating roller 71 and the pressure roller 72, so that the developer image transferred onto the sheet S is thermally fixed to the sheet S.

The discharge unit 8 includes a pair of discharge rollers 81 and a discharge tray 82. The pair of discharge rollers 81 discharges the sheet S conveyed from the fixing unit 70 toward the outside of the casing 2. The discharge tray 82 is formed on an upper surface of the casing 2. The sheet S discharged outside the casing 2 by the pair of discharge rollers 81 is received on the discharge tray 82.

The power supply 9 is disposed rearward of the image forming unit 5 within the casing 2. For example, the power supply 9 is configured as a low-voltage power supply.

The casing 2 has a substantially rectangular parallelepiped shape. The casing 2 accommodates therein the sheet supply unit 3, the image forming unit 5, the motor 4, the power supply 9, and the like. The casing 2 has a front surface constituting a front cover 21, and the rear surface constituting a rear cover 22. Further, the casing 2 has a one side surface constituting a right cover 23, and the other side surface constituting a left cover 24.

<Main Body Frame>

A main body frame 10 is disposed within the casing 2, and includes a right frame 11 and a left frame 12. The main body frame 10 is an example of the claimed "frame," the right frame 11 is an example of the claimed "first frame," and the left frame 12 is an example of the claimed "second frame."

The right and left frames 11 and 12 are plate-like members disposed in confrontation with each other in the leftward/rightward direction. The right and left frames 11 and 12 are spaced apart from each other by a predetermined distance in the leftward/rightward direction. The right frame 11 extends in the vertical direction. That is, the right frame 11 extends in the upward/downward direction. More specifically, the right frame 11 vertically extends along the right cover 23. The right frame 11 positioned at a position adjacent to the right cover 23. The left frame 12 extends in the vertical direction. That is, the left frame 12 extends in the upward/downward direction. More specifically, the left frame 12 vertically extends along the left cover 24. The left frame 12 positioned at a position adjacent to the left cover 24.

The image forming unit 5 and the power supply 9 are disposed between and supported to the right and left frames 11 and 12. That is, the right frame 11 is disposed between the right cover 23 and the power supply 9, and the left frame 12 is disposed between the left cover 24 and the power supply 9. Stated differently, the right and left frames 11 and 12 are disposed outward of the power supply 9 within the casing 2. The image forming unit 5 is positioned closer to the power supply 9 in the leftward/rightward direction in the casing 2 than the right and left frames 11 and 12 are to the power supply 9. The image forming unit 5 is positioned at a side the same as the power supply 9 with respect to the right frame 11 in the leftward/rightward direction within the casing 2. Further, the image forming unit 5 is positioned at a side the same as the power supply 9 with respect to the left frame 12 in the leftward/rightward direction within the casing 2.

The main body frame 10 including the right and left frames 11 and 12 is made from a resin. The main body frame 10 has a first portion 10A made from a flame retardant resin and second portions 10B made from a resin having lower flame retardancy than that of the first portion 10A.

Figure 3:
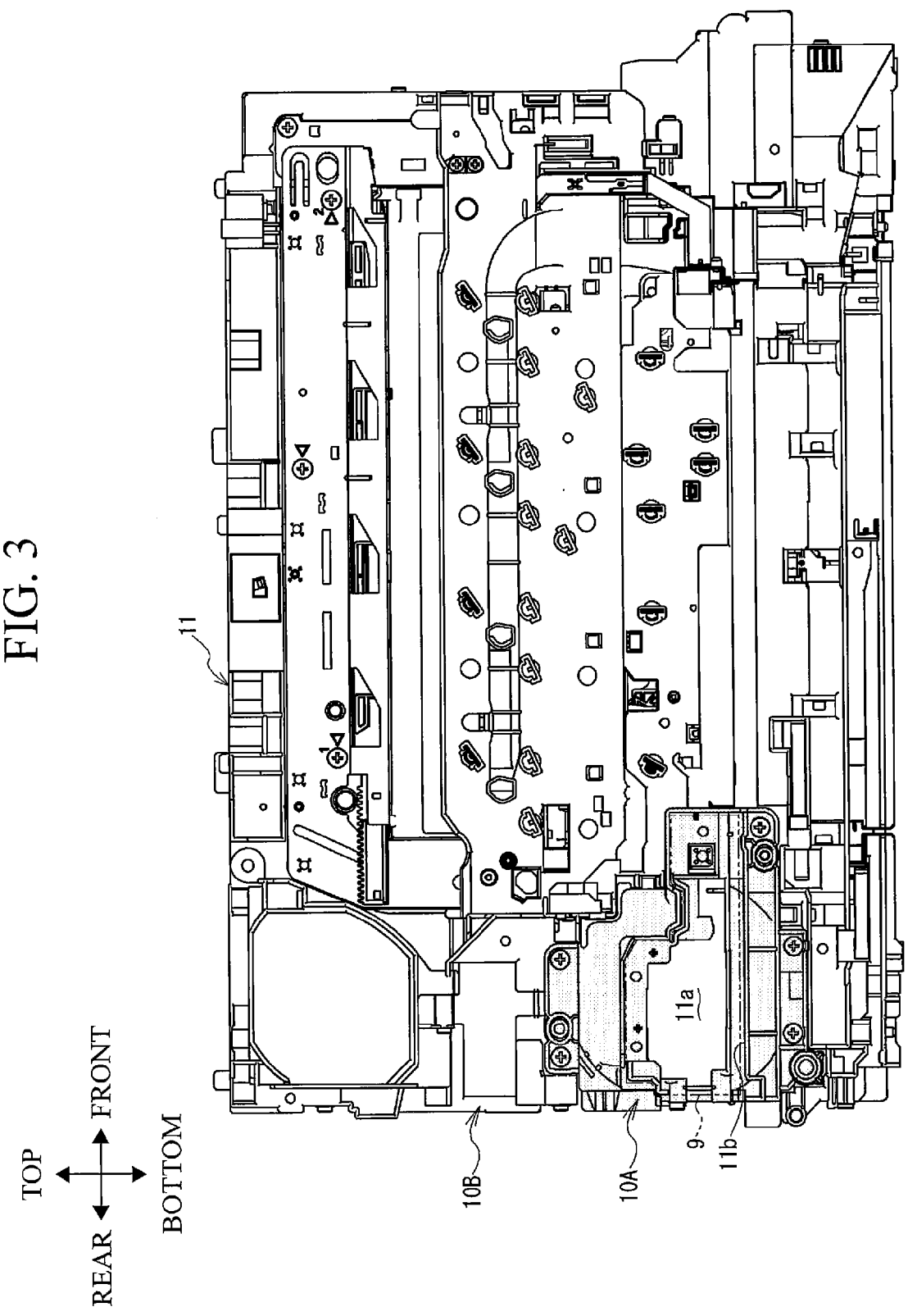
FIG. 3 is a side view of a right frame of the image forming apparatus according to the embodiment, illustrating an inner surface of the right frame.
Figure 4:
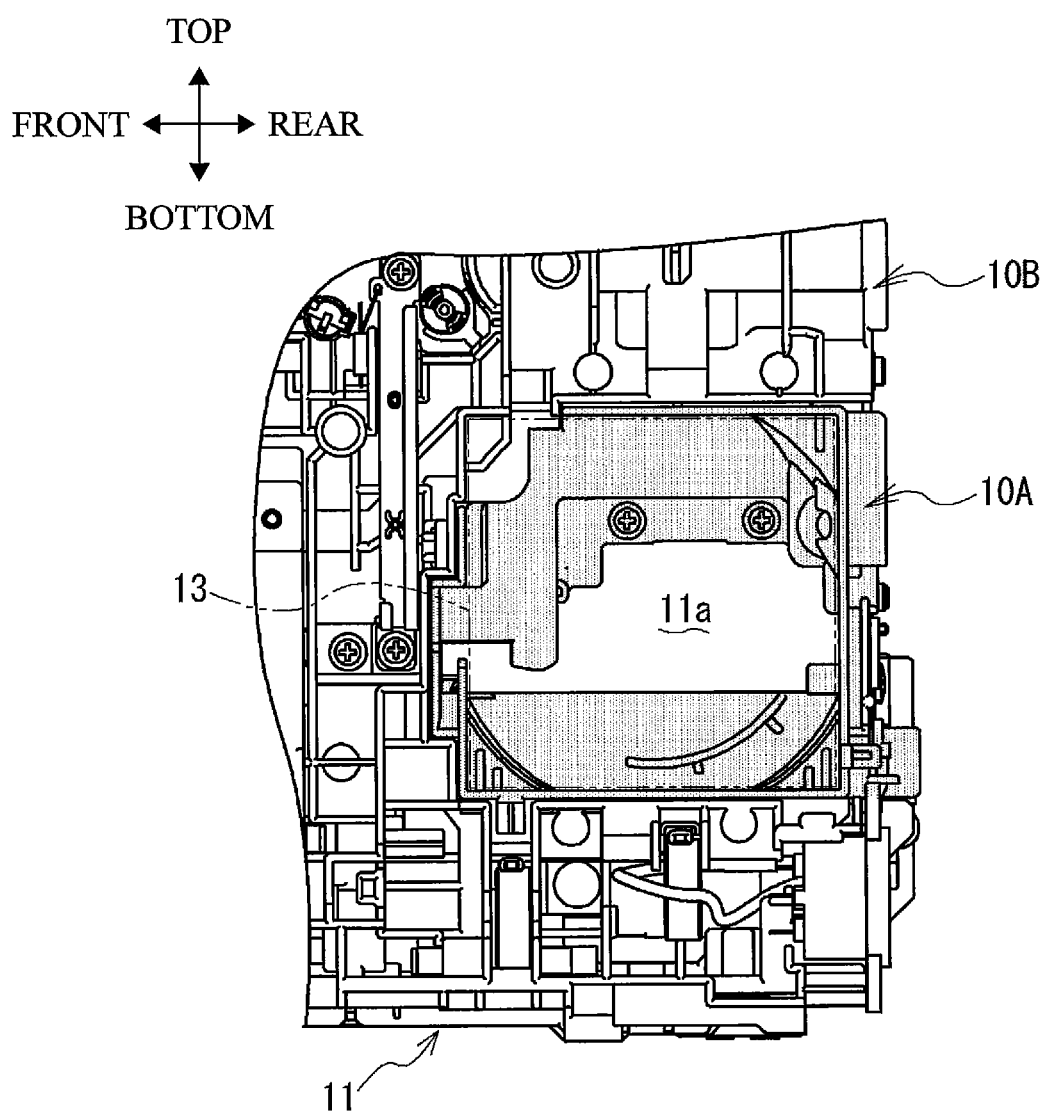
FIG. 4 is a side view of the right frame of the image forming apparatus according to the embodiment, illustrating a part of an outer surface of the right frame.
Figure 5:
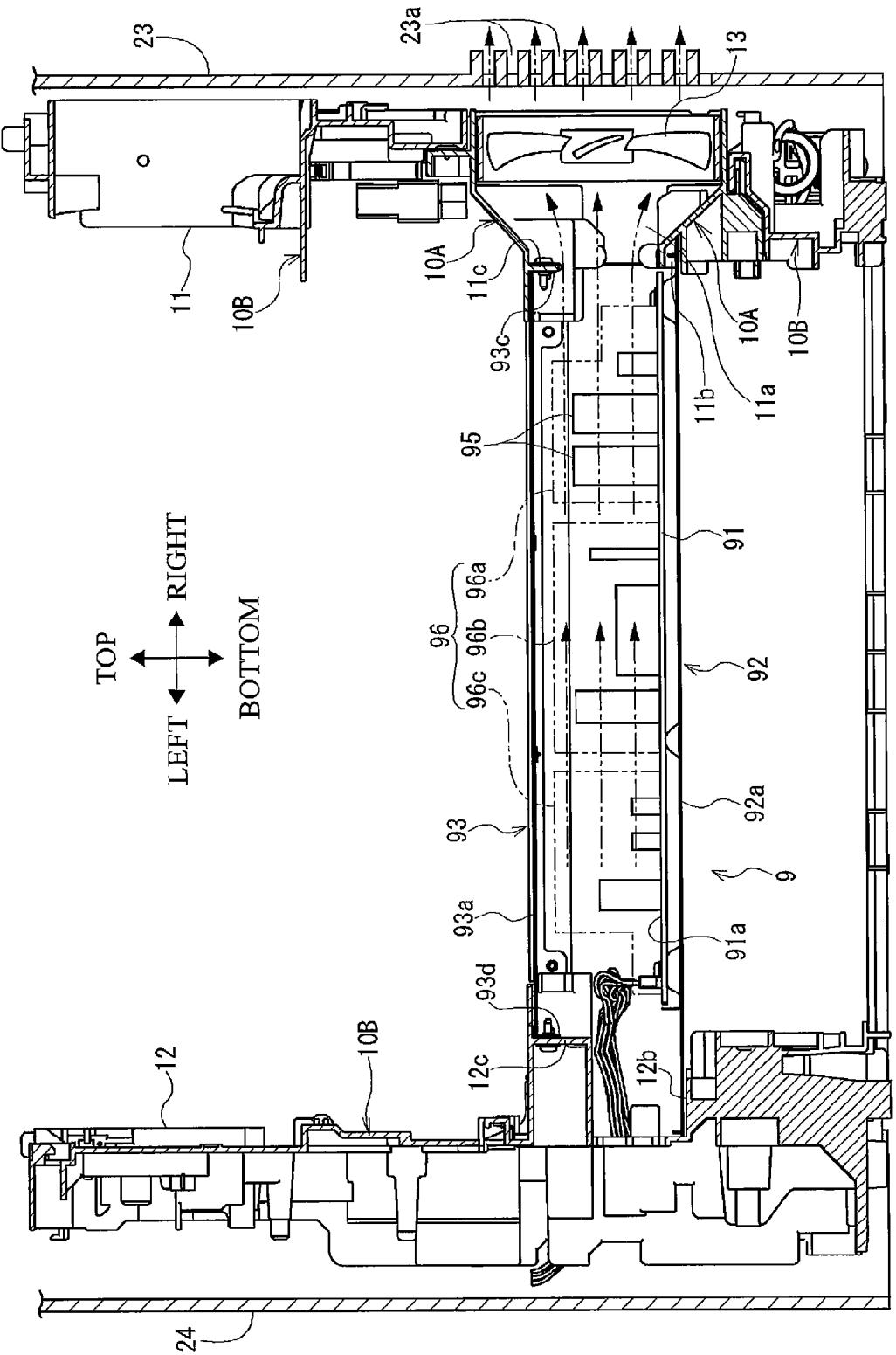
FIG. 5 is a cross-sectional view of a power supply of the image forming apparatus according to the embodiment, the cross-sectional view being taken along a plane orthogonal to a frontward/rearward direction, the cross-sectional view illustrating a state where the power supply is supported by the right frame and a left frame.

As illustrated in FIGS. 3 to 5, the right frame 11 has the first and second portions 10A and 10B. The first portion 10A constitutes a rear end portion of the right frame 11. The first portion 10A in the right frame 11 is indicated by a shaded portion in FIGS. 3 and 4. The left frame 12 in its entirety is constituted by the second portion 10B. The first portion 10A is an example of the claimed "first part." The second portion 10B is an example of the claimed "second part."

For example, the flame retardant resin forming the first portion 10A may be a resin material, such as a polycarbonate resin, having flame retardancy that conforms to a flame retardant grade equal to or higher than the UL94-5VB grade specified by the UL standard. For example, the resin forming the second portion 10B may be a resin material having flame retardancy that conforms to a flame retardant grade equivalent to the UL94-HB grade specified by the UL standard. Note that, the UL standard is a flammability standard released by Underwriters Laboratories of the United States.

The right frame 11 is formed with a through-hole 11a extending therethrough in the leftward/rightward direction. Both side spaces of the right frame 11 in the leftward/rightward direction (i.e., a right cover side space and a power supply side space of the right frame 11) are communicated with each other by the through-hole 11a. That is, The through-hole 11a has one open end which is open to the right cover 23 of the casing 2 (an inner surface of the casing 2) and the other open end which is open to the power supply 9. The through-hole 11a is formed at the rear end portion of the right frame 11.

In the right frame 11, the first portion 10A constitutes an ambient portion surrounding the through-hole 11a. In the present embodiment, the first portion 10A surrounds the entire circumference of the through-hole 11a. That is, in the present embodiment, the through-hole 11a is formed at a portion of the right frame 11 which portion is constituted by the first portion 10A.

For example, the right frame 11 can be obtained by separately forming the first and second portions 10A and 10B and then attaching the first portion 10A to the second portion 10B. Alternatively, the right frame 11 can be formed by integrally forming the first and second portions 10A and 10B through insertion molding.

A fan 13 is fitted into the through-hole 11a of the right frame 11. In the present embodiment, the fan 13 is a discharge fan for discharging atmosphere inside the casing 2 to the outside thereof through a discharge ports 23a formed at the right cover 23.

A support groove 11b is formed at the right frame 11. More specifically, the support groove 11b is formed at the portion of the right frame 11 which portion is constituted by the first portion 10A. The support groove 11b is positioned below the other open end of the through-hole 11a and extends in the horizontal direction from the outside of the casing 2 toward the inside thereof. In the present embodiment, the support groove 11b extends in the frontward/rearward direction. The support groove 11b is an example of the claimed "groove."

<Power Supply>

Figure 6:
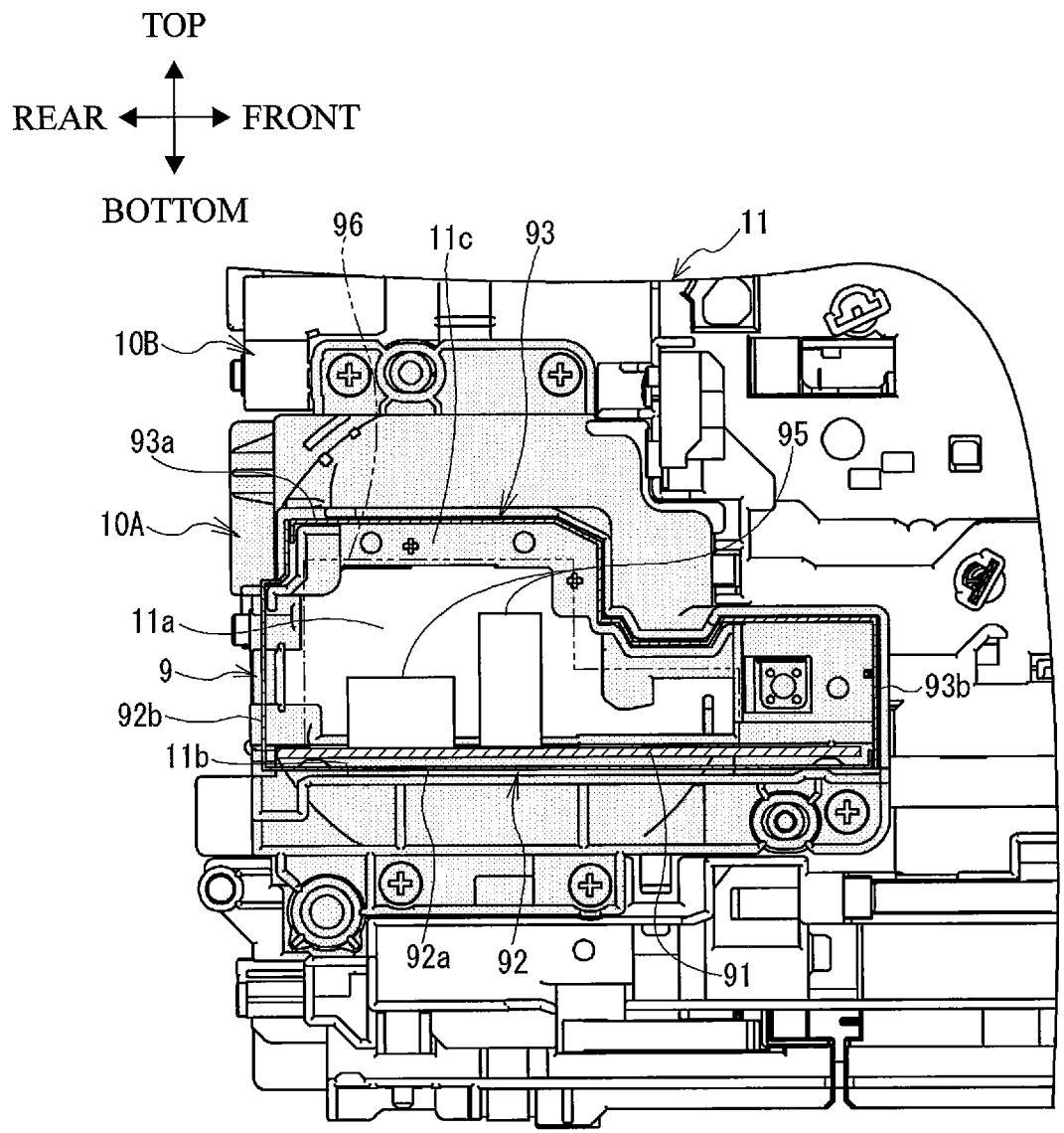
FIG. 6 is a cross-sectional view of the power supply of the image forming apparatus according to the embodiment, the cross-sectional view being taken along a plane orthogonal to a frontward/rearward direction, the cross-sectional view illustrating a state where the power supply is supported by a first portion of the right frame.
Figure 7:
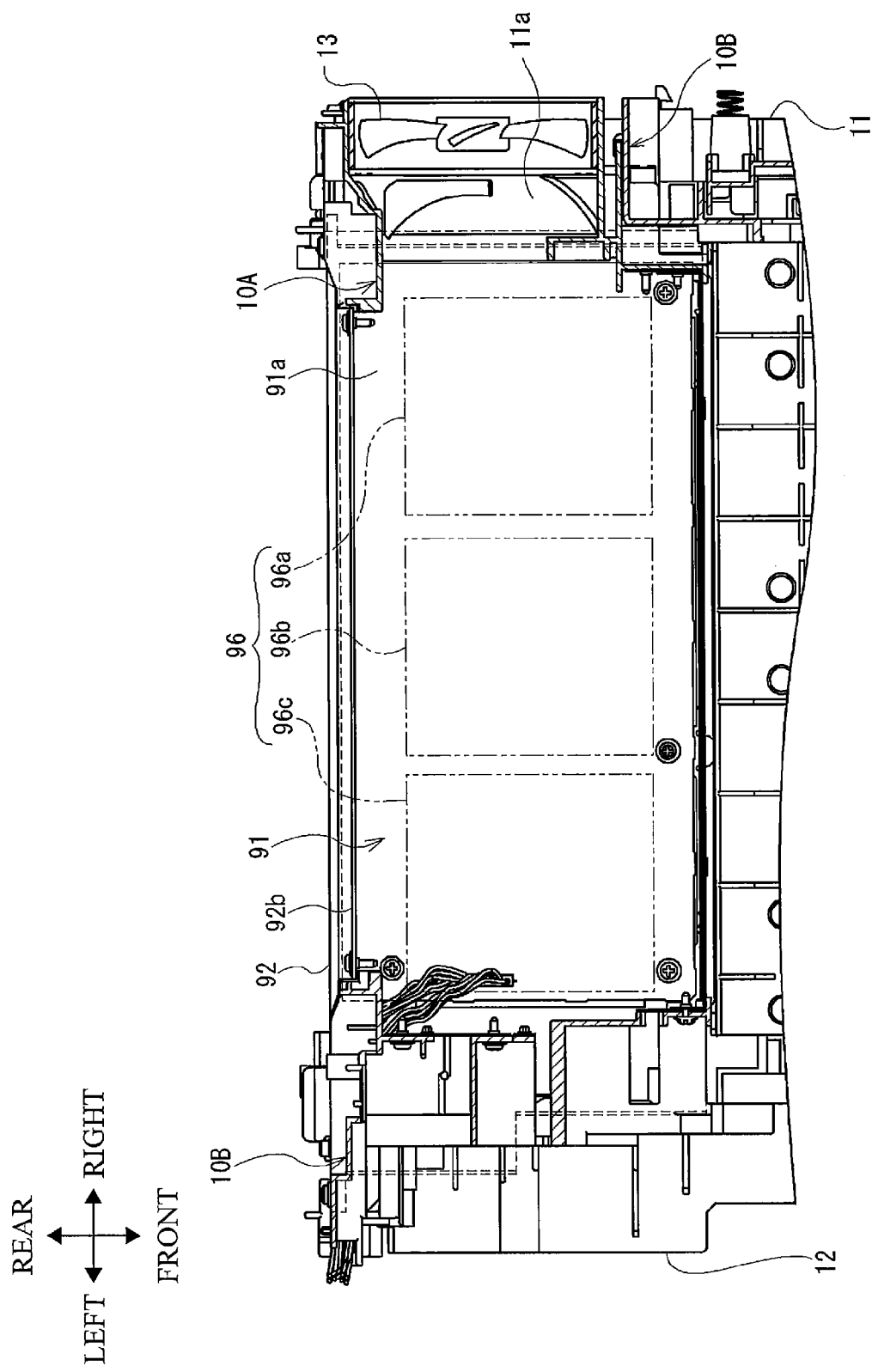
FIG. 7 is a cross-sectional view of the power supply of the image forming apparatus according to the embodiment, the cross-sectional view being taken along a plane orthogonal to a upward/downward direction, the cross-sectional view illustrating the state where the power supply is supported by the right frame and the left frame.

As illustrated in FIGS. 5 to 7, the power supply 9 includes a power supply board 91 on which power supply components 95 are mounted, and lower and upper covers 92 and 93 that cover the power supply board 91. The power supply board 91 has a mounting surface 91a on which the power supply components 95 are mounted. The power supply board 91 is disposed in such a manner that the mounting surface 91a faces upward. The power supply board 91 is supported to the lower cover 92.

The lower cover 92 supports the power supply board 91, and includes a lower surface cover part 92a and a rear surface cover part 92b. The lower surface cover part 92a supports the power supply board 91 and covers a lower surface of the power supply board 91. The rear surface cover part 92b covers a rear surface of the power supply board 91.

The upper cover 93 includes an upper surface cover part 93a and a front surface cover part 93b. The upper surface cover part 93a covers an upper surface of the power supply board 91. The front surface cover part 93b covers a front surface of the power supply board 91. The upper cover 93 is an example of the claimed "cover member."

The lower cover 92 and the upper cover 93 are connected to each other. The front, rear, upper and lower surfaces of the power supply board 91 are entirely covered by the lower and upper covers 92 and 93.

Each of the power supply board 91, the lower cover 92, and the upper cover 93 extends in the leftward/rightward direction. The lower surface cover part 92a of the lower cover 92 has one end portion and the other end portion in the leftward/rightward direction. The one end portion of the lower surface cover part 92a is closer to the right frame 11 than the other end portion of the lower surface cover part 92a is to the right frame 11. The one end portion of the lower surface cover part 92a is supported to the support groove 11b of the right frame 11 so as to be slidably movable relative to the support groove 11b in the frontward/rearward direction. The other end portion of the lower surface cover part 92a is closer to the left frame 12 than the one end portion of the lower surface cover part 92a is to the left frame 12. The other end portion of the lower surface cover part 92a is supported to a support part 12b provided at the left frame 12 so as to be slidably movable relative to the support part 12b in the frontward/rearward direction.

The upper surface cover part 93a of the upper cover 93 has one end portion and the other end portion in the leftward/rightward direction. The one end portion of the upper surface cover part 93a is closer to the right frame 11 than the other end portion of the upper surface cover part 93a is to the right frame 11. The one end portion of the upper surface cover part 93a is connected to a connecting part 11c provided at the right frame 11. The other end portion of the upper surface cover part 93a is closer to the left frame 12 than the one end portion of the upper surface cover part 93a is to the left frame 12. The other end portion of the upper surface cover part 93a is connected to a connecting part 12c provided at the left frame 12.

Specifically, the connecting part 11c of the right frame 11 is a support piece extending in the upward/downward direction, and the upper surface cover part 93a has a connecting piece 93c formed by bending downward the one end portion of the upper surface cover part 93a. The connecting part 11c of the right frame 11 and the connecting piece 93c of the upper surface cover part 93a are in confrontation with each other in the horizontal direction, and are connected by a connector such as a screw in a state where they contact each other. As a result, the one end portion of the upper surface cover part 93a and the first portion 10A of the right frame 11 are connected to each other in the horizontal direction. In the present embodiment, the one end portion of the upper surface cover part 93a is connected to the first portion 10A of the right frame 11 in the leftward/rightward direction. The one end portion of the upper surface cover part 93a of the upper cover 93 is an example of the claimed "one end portion of the cover member."

The connecting part 12c of the left frame 12 is a support piece extending in the upward/downward direction, and the upper surface cover part 93a has a connecting piece 93d formed by bending downward the other end portion of the upper surface cover part 93a. The connecting part 12c of the left frame 12 and the connecting piece 93d of the upper surface cover part 93a are in confrontation with each other in the horizontal direction, and are connected by a connector such as a screw in a state where they contact each other. As a result, the other end portion of the upper surface cover part 93a and the left frame 12 are connected to each other in the horizontal direction. In the present embodiment, the other end portion of the upper surface cover part 93a is connected to the left frame 12 in the leftward/rightward direction. The other end portion of the upper surface cover part 93a of the upper cover 93 is an example of the claimed "another end portion of the cover member."

The power supply 9 has a power supply circuit 96. The power supply circuit 96 includes a primary circuit 96a, a conversion circuit 96b, and a secondary circuit 96c, each of which is constituted by circuits formed on the power supply board 91 and the power supply components 95 mounted on the power supply board 91. That is, the power supply circuit 96 is constituted by circuits formed on the power supply board 91 and the power supply components 95 mounted on the power supply board 91.

The primary circuit 96a is inputted with a voltage from an external power supply. The conversion circuit 96b is configured to convert the voltage inputted from the external power supply into a predetermined voltage. The secondary circuit 96c is configured to output the predetermined voltage to the image forming unit 5.

The primary circuit 96a, the conversion circuit 96b, and the secondary circuit 96c are arranged in this order in a direction from the right frame 11 to the left frame 12.

The power supply board 91 on which the power supply circuit 96 is formed has one end portion and the other end portion in the leftward/rightward direction. The one end portion of the power supply board 91 is closer to the right frame 11 than the other end portion is to the right frame 11. The one end portion of the power supply board 91 is positioned adjacent to the first portion 10A of the right frame 11. Thus, the primary circuit 96a which is disposed closest to the right frame 11 in the power supply circuit 96 is positioned adjacent to the first portion 10A of the right frame 11. Further, the primary circuit 96a is disposed at a position facing, in the horizontal direction, the fan 13 fitted into the through-hole 11a. In the present embodiment, the primary circuit 96a faces the fan 13 in the leftward/rightward direction.

The power supply components 95 mounted on the power supply board 91 are disposed at a position facing the through-hole 11a of the right frame 11 in the horizontal direction. In the present embodiment, the power supply components 95 and the through-hole 11a face each other in the leftward/rightward direction. Since the power supply components 95 faces the through-hole 11a in the horizontal direction and the fan 13 that discharges atmosphere inside the casing 2 to the outside thereof is fitted into the through-hole 11a, an airflow directed from the power supply components 95 toward the through-hole 11a is generated by the fan 13. By this airflow, atmosphere around the power supply components 95 is discharged outside the casing 2.

The through-hole 11a of the right frame 11 has a fitting portion in which the fan 13 is fitted. At positions adjacent to the through-hole 11a of the right frame 11, the support groove 11b and the connecting part 11c are disposed inward of the fitting portion of the through-hole 11a in the leftward/rightward direction. Stated differently, the support groove 11b and the connecting part 11c are closer to the center of the casing 2 in the leftward/rightward direction than the fitted portion is to the center of the casing 2.

Further, the through-hole 11a has a portion positioned at a position the same as the support groove 11b and the connecting part 11c in the leftward/rightward direction, and the portion has an opening area smaller than that of the fitting portion of the through-hole 11a. The opening area of the through-hole 11a is gradually reduced from the fitting portion toward the portion positioned at the same position as the support groove 11b and the connecting part 11c.

As described above, the portion of the through-hole 11a positioned at the same positon as the support groove 11b and the connecting part 11c in the leftward/rightward direction has the opening area smaller than that of the fitting portion of the through-hole 11a. Hence, the speed of the airflow of the fan 13 around the power supply components 95 of the power supply 9 supported to both the support groove 11b and the connecting part 11c is faster than that in the fitted portion of the through-hole 11a. In other words, the airflow generated by the fan 13 flows around the power supply components 95 at a speed faster than that of the airflow flowing through the fitting portion of the through-hole 11a. Accordingly, enhanced efficiency in discharging atmosphere around the power supply components 95 toward the outside of the casing 2 can be obtained.

<Attachment of Power Supply to Main Body Frame>

Figure 8:
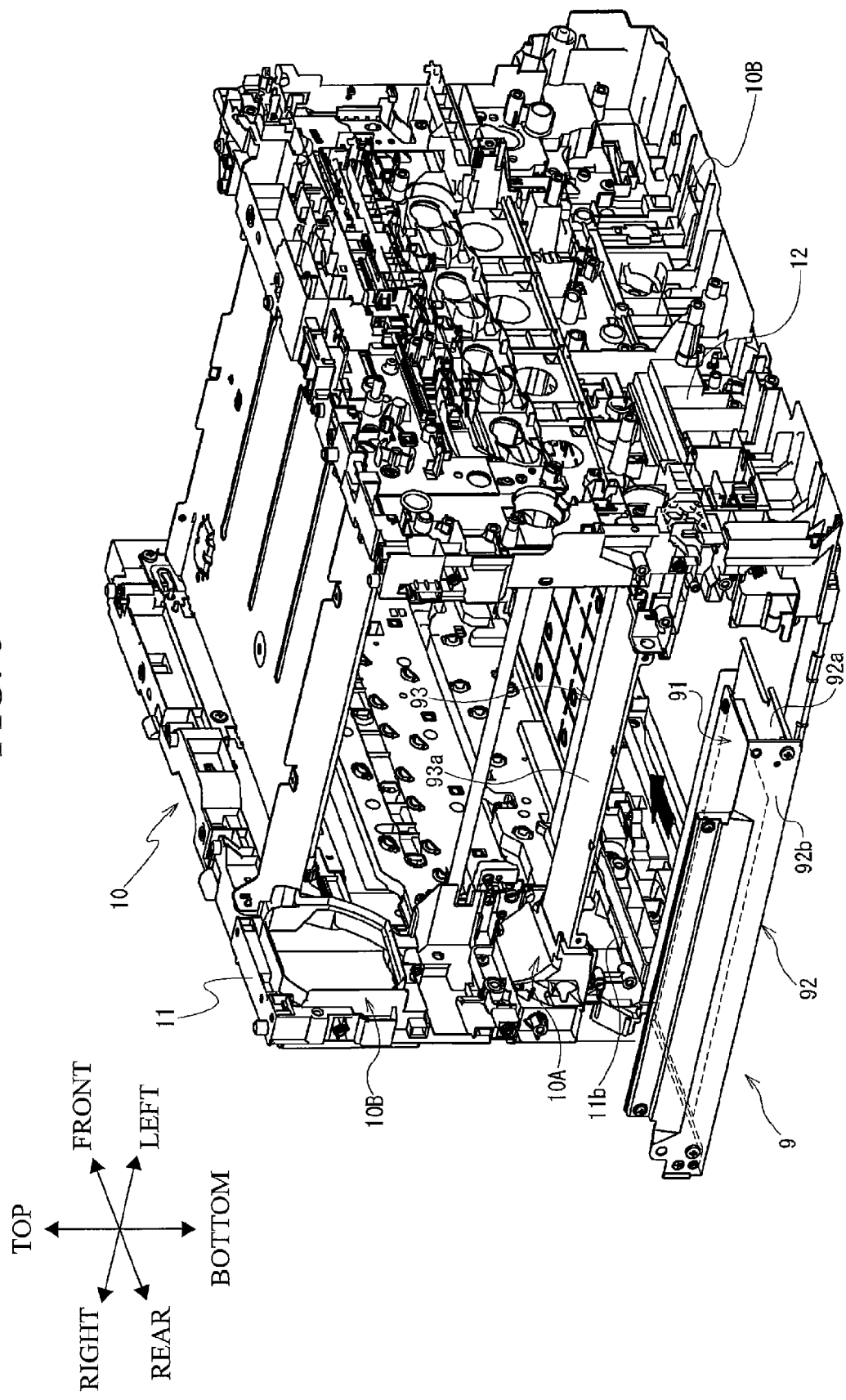
FIG. 8 is a perspective view of the image forming apparatus according to the embodiment, the perspective view being for explaining how the power supply is attached to a main body frame.

The power supply 9 can be attached to the main body frame 10 as follows. For example, as illustrated in FIG. 8, the lower cover 92 in a state of supporting the power supply board 91 can be attached to the main body frame 10 to which the upper cover 93 has been previously attached. Note that, in the state where the upper cover 93 is attached to the main body frame 10, the one end portion of the upper surface cover part 93a of the upper cover 93 is connected to the connecting part 11c of the right frame 11 in the horizontal direction, and the other end portion of the upper surface cover part 93a of the upper cover 93 is connected to the connecting part 12c of the left frame 12 in the horizontal direction.

As described above, by inserting the lower cover 92 in the state of supporting the power supply board 91 from the rear side into the main body frame 10 where the upper cover 93 has been attached between the right and left frames 11 and 12, the power supply 9 can be attached to the main body frame 10.

Specifically, in a state where the one end portion of the lower surface cover part 92a of the lower cover 92 is fitted in the support groove 11b of the right frame 11 and the other end portion of the lower surface cover part 92a is placed on the support part 12b of the left frame 12, the lower cover 92 is inserted into the main body frame 10.

The lower cover 92 is inserted into the main body frame 10 as follows. That is, the lower cover 92 is inserted to a position where the power supply components 95 mounted on the power supply board 91 face the through-hole 11a, while the one and other end portions of the lower surface cover part 92a are slid with respect to the support groove 11b of the right frame 11 and the support part 12b of the left frame 12, respectively.

After the insertion of the lower cover 92 into the main body frame 10, positioning of the lower cover 92 with respect to the main body frame 10 is secured by connecting the lower cover 92 to the upper cover 93 using a connector, thereby resulting in completion of the attachment of the power supply 9 to the main body frame 10.

While the description has been made in detail with reference to the above embodiment, it would be apparent to those skilled in the art that various changes and modifications may be made thereto.

<Variations to the Present Embodiment>

In the above-described embodiment, the first portion 10A in the main body frame 10 surrounds the entire circumference of the through-hole 11a formed at the right frame 11. However, the configuration of the first portion 10A is not limited to this.

<First Variation of the Present Embodiment>

Figure 9A:
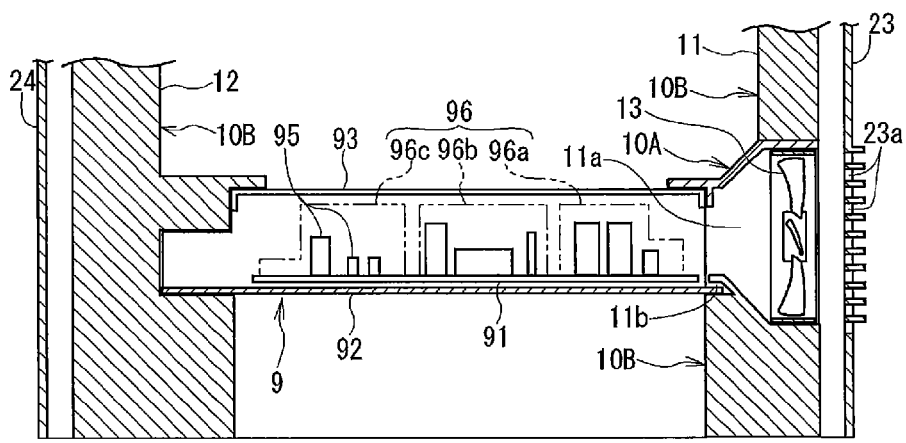
FIG. 9A is a cross-sectional view of an image forming apparatus according to a first variation of the embodiment, the cross-sectional view being taken along a plane orthogonal to the frontward/rearward direction.
Figure 9B:
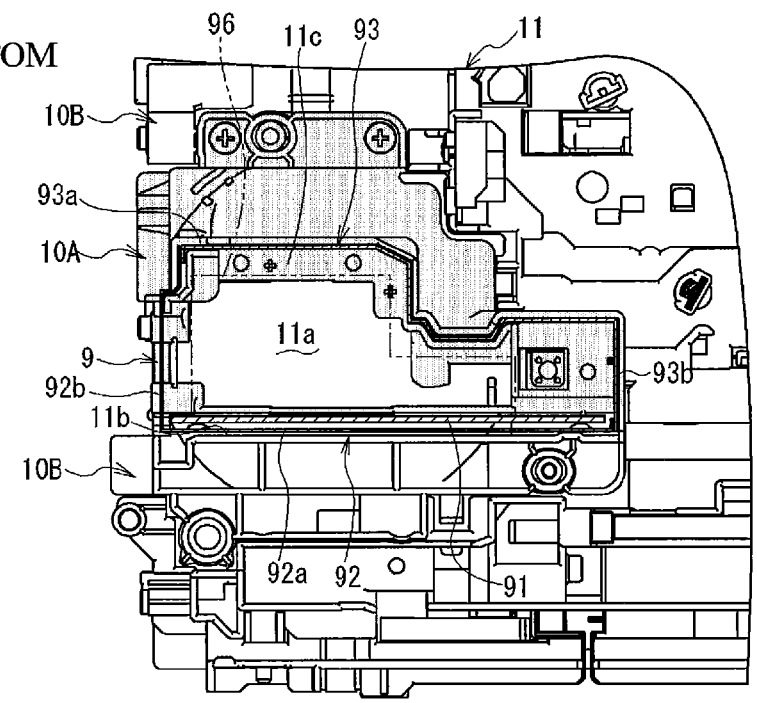
FIG. 9B is a cross-sectional view of the image forming apparatus according to the first variation of the embodiment, the cross-sectional view being taken along a plane orthogonal to the leftward/rightward direction.

For example, in the first variation, the ambient portion includes a first region at a side the same as the power supply components 95 with respect to the mounting surface 91a, and a second region at a side opposite to the power supply components 95 with respect to the mounting surface 91a. More specifically, the first region is a portion of the ambient portion above the mounting surface 91a, and the second region is a portion of the ambient portion below the mounting surface 91a. As illustrated in FIGS. 9A and 9B, in the right frame 11, the first portion 10A may be limited to the first region of the ambient portion. That is, the first portion 10A may constitute only the first region of the ambient portion. In this case, as illustrated in FIGS. 9A and 9B, the second portion 10B may constitute the second region of the ambient portion and a portion of the right frame 12 other than the ambient portion.

<Other Variations>

In the first variation, the first portion 10A constitutes the entire first region of the ambient portion. Alternatively, for example, in the right frame 11, the first portion 10A may be limited to at least a part of the first region of the ambient portion. In other words, in the right frame 11, the first portion 10A may constitute a part of the first region of the ambient portion.

Further, in the above-described embodiment, a portion of the right frame 11 other than the first portion 10A is constituted by the second portion 10B, and also the entire left frame 12 is constituted by the second portion 10B. However, the configuration of the second portions 10B is not limited to this. That is, in the main body frame 10, a portion other than the first portion 10A constituting the ambient portion need not be entirely constituted by the second portions 10B. This means that the first portion 10A may exist in the portion of the main body frame 10 other than the ambient portion.

<Second Variation of the Present Embodiment>

In the above-described embodiment, the fan 13 is fitted in the through-hole 11a of the right frame 11. However, the arrangement of the fan 13 is not limited to this. For example, as illustrated in FIG. 10, the fan 13 may be disposed between the through-hole 11a of the right frame 11 and the right cover 23, in place of being fitted in the through-hole 11a of the right frame 11.

Even when the fan 13 is disposed between the through-hole 11a and the right cover 23, an airflow directed from the power supply components 95 toward the through-hole 11a can be generated by the fan 13. Hence, by this airflow, atmosphere around the power supply components 95 can be discharged outside the casing 2.

Figure 10:
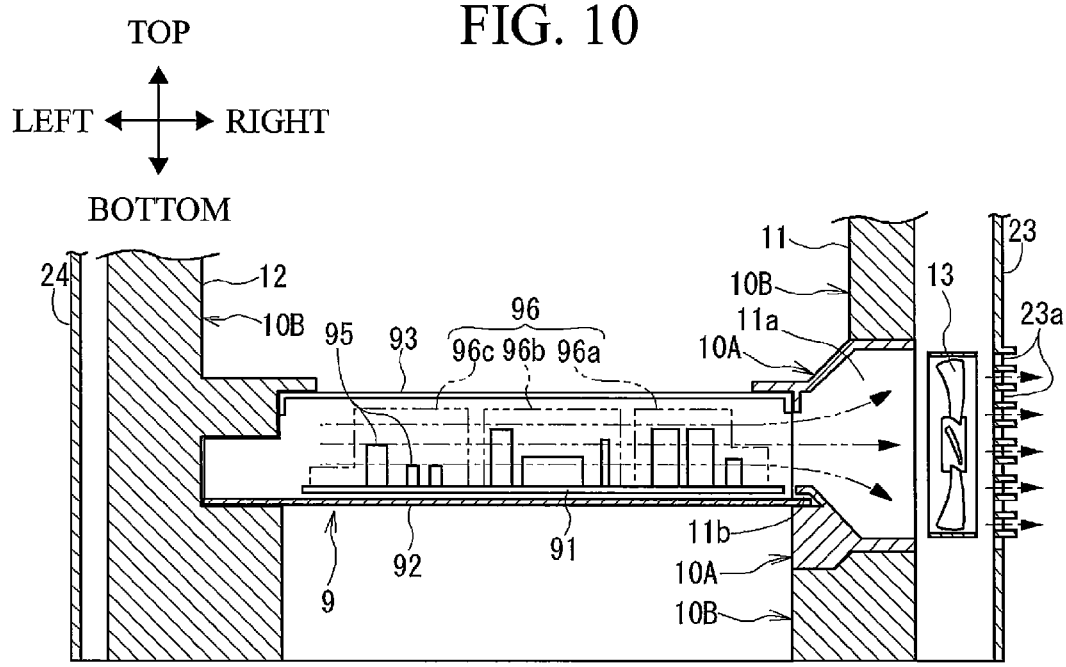
FIG. 10 is a cross-sectional view of an image forming apparatus according to a second variation of the embodiment, the cross-sectional view being taken along a plane orthogonal to the frontward/rearward direction.

Further, the fan 13 illustrated in FIG. 10 is disposed on an imaginary straight line passing through both the power supply 9 and the through-hole 11a, thereby enabling the fan 13 to efficiently discharge atmosphere around the power supply components 95 to the outside of the casing 2 through the through-hole 11a.

However, the fan 13 need not necessarily be disposed on the imaginary straight line passing through the power supply 9 and the through-hole 11a. The fan 13 may be disposed at a position shifted from the imaginary straight line passing through the power supply 9 and the through-hole 11a. In this case, as well, atmosphere around the power supply components 95 can be sucked and discharged outside the casing 2. In this arrangement, provided that the through-hole 11a and the fan 13 are connected by a duct, enhanced efficiency in discharging atmosphere around the power supply components 95 can be obtained.

<Third Variation of the Present Embodiment>

Figure 11:
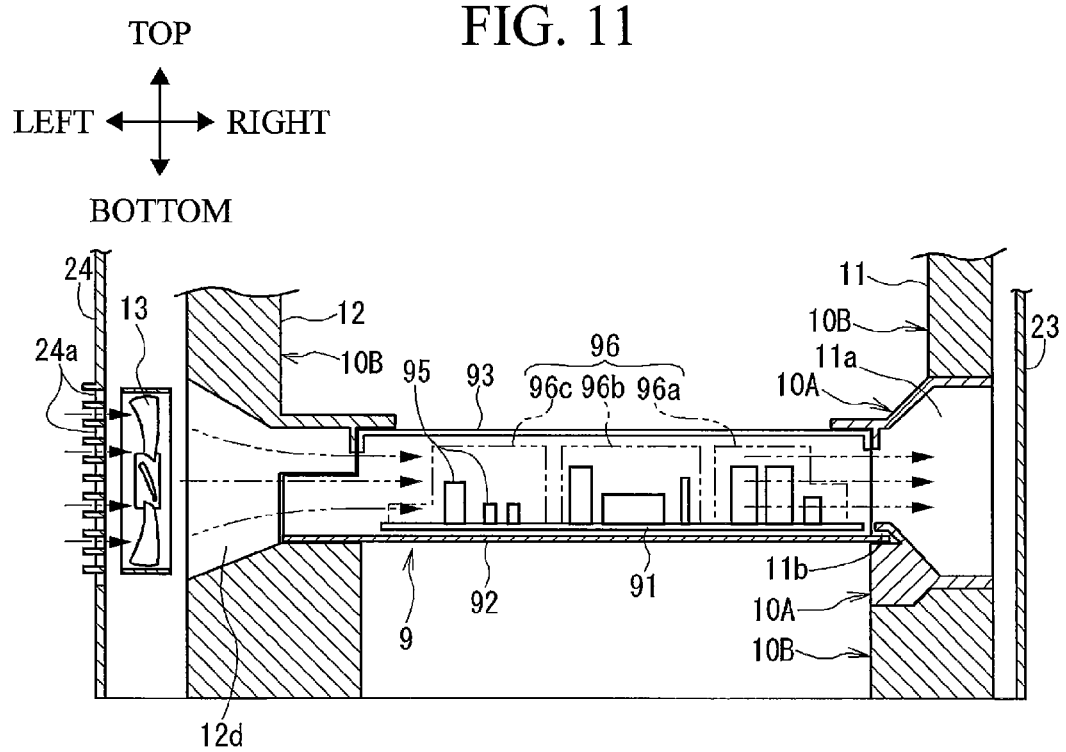
FIG. 11 is a cross-sectional view of an image forming apparatus according to a third variation of the embodiment, the cross-sectional view being taken along a plane orthogonal to the frontward/rearward direction.

Further, the fan 13 may be configured as a suction fan that sucks atmosphere outside the casing 2 into the casing 2. In this case, as illustrated in FIG. 11, the fan 13 may be disposed between the left frame 12 and left cover 24. Further, preferably, the left frame 12 is formed with a through-hole 12d extending therethrough in the leftward/rightward direction, and the left cover 24 is formed with inlet ports 24a. In this case, both side spaces of the left frame 12 in the leftward/rightward direction (i.e., a left cover side space and a power supply side space of the left frame 12) are communicated with each other by the through-hole 12d.

That is, the through-hole 12d has one open end which is open to the left cover 24 (an inner surface of the casing 2) and the other open end which is open to the power supply 9.

Thus, the fan 13 disposed between the left frame 12 and the left cover 24 can take atmosphere outside the casing 2 into the casing 2 through the inlet ports 24a and generate an airflow directed from the through-hole 12d of the left frame 12 to the power supply components 95 and further to the through-hole 11a of the right frame 11.

<Effects of Present Embodiment>

In the present embodiment, the image forming apparatus 1 is configured as described above. That is, the image forming apparatus 1 as an electric apparatus includes the casing 2, the power supply 9, the main body frame 10, and the fan 13. The power supply 9 is accommodated in the casing 2 and includes the power supply board 91 on which the power supply components 95 are mounted. The right frame 11 of the main body frame 10 extends in the upward/downward direction and is disposed between the right cover 23 of the casing 2 and the power supply 9 within the casing 2. The right frame 11 is formed with the through-hole 11a extending therethrough in the leftward/rightward direction. Both side spaces of the right frame 11 in the leftward/rightward direction (i.e., the right cover side space and the power supply side space of the right frame 11) are communicated with each other by the through-hole 11a. The fan 13 is configured to generate the airflow directed from the power supply 9 to the through-hole 11a. The power supply 9 is disposed such that the power supply components 95 face the through-hole 11a in the horizontal direction. The first portion 10A is made from the flame retardant resin, and constitutes at least a part of the ambient portion of the right frame 11. The part constituted by the first portion 10A (i.e., the at least a part of the ambient portion which is constituted by the first portion 10A) is positioned at a side the same as the power supply component 95 with respect to the mounting surface 91a. The second portion 10B is made from the material having flame retardancy lower than that of the first portion 10A. The second portion 10B constitutes at least a part of the main body frame 10 except the part constituted by the first portion 10A.

Further, the image forming apparatus 1 has the image forming unit 5. The image forming unit 5 is accommodated in the casing 2 and is disposed at a side the same as the power supply 9 with respect to the right frame 11 in the leftward/rightward direction within the casing 2.

Further, in the image forming apparatus 1, the main body frame 10 includes the right frame 11 and the left frame 12 which are in confrontation with each other. The image forming unit 5 and the power supply 9 are disposed between the right and left frames 11 and 12. The through-hole 11a is formed in the right frame 11, and the first portion 10A is positioned at the right frame 11.

As described above, the through-hole 11a faces the power supply components 95, and the ambient portion of the right frame 11 surrounds the through-hole 11a. Further, the first portion 10A made from the flame retardant resin constitutes at least a part of the ambient portion of the right frame 11, and the part constituted by the first portion 10A is positioned at a side the same as the power supply components 95 with respect to the mounting surface 91a. Hence, the power supply 9 can be disposed close to the right frame 11, thereby enabling the image forming apparatus 1 to be made compact.

In the above-described embodiment and the variations thereto, the right frame 11 is not entirely made from the flame retardant resin, but is constituted by both the first portion 10A made from the flame retardant resin and the second portion 10B made from the resin having lower flame retardancy than that of the first portion 10A. Accordingly a reduction in cost of the main body frame 10 can be attained.

The power supply 9 has the upper cover 93 that covers the power supply board 91, and the one end portion of the upper surface cover part 93a of the upper cover 93 is connected to the first portion 10A of the right frame 11 in the horizontal direction.

By this connection between the one end portion of the upper surface cover part 93a of the upper cover 93 and the first portion 10A of the right frame 11 in the horizontal direction, enhanced strength of the right frame 11 can be obtained.

In addition to the connection between the one end portion of the upper surface cover part 93a of the upper cover 93 and the first portion 10A of the right frame 11, the other end portion of the upper surface cover part 93a of the upper cover 93 is connected to the left frame 12 in the horizontal direction. Hence, strength of the entire main body frame 10 can be enhanced.

Further, the primary circuit 96a, the conversion circuit 96b, and the secondary circuit 96c are formed on the power supply board 91 of the power supply 9 in this order in the direction from the right frame 11 to the left frame 12.

Even if the primary circuit 96a on the power supply board 91 is disposed at a side the same as the right frame 11 with respect to the center of the casing 2 in the leftward/rightward direction, the primary circuit 96a can be disposed adjacent to the right frame 11 since the first portion 10A in the right frame 11 is made from the flame retardant resin. Thus, the image forming apparatus 1 can be made compact, and a cost reduction can be achieved.

Further, in the image forming apparatus 1, the primary circuit 96a can be disposed close to the right frame 11 despite that the primary circuit 96a faces the fan 13 in the horizontal direction. This is because the first portion 10A in the right frame 11 is made from the flame retardant resin. Thus, the image forming apparatus 1 can be made compact, and a cost reduction can be achieved.

Further, the support groove 11b that extends in the horizontal direction from the outside of the casing 2 to the inside thereof is formed in the first portion 10A of the right frame 11, and the power supply 9 is supported by the first portion 10A so as to be slidable along the support groove 11b.

With this configuration, when the power supply 9 is attached to the main body frame 10 in the casing 2, the power supply 9 can be slid from the outside of the casing 2 to the inside thereof along the support groove 11b formed in the first portion 10A of the right frame 11. Accordingly, workability in attaching the power supply 9 to the main body frame 10 can be improved.

Further, the fan 13 is disposed on the imaginary straight line passing through the power supply 9 and the through-hole 11a of the right frame 11, and the power supply 9 is supported by at least the first portion 10A of the right frame 11.

With this configuration, the power supply 9 can be disposed close to the through-hole 11a, and atmosphere around the power supply components 95 in the power supply 9 can be efficiently discharged through the through-hole 11a by the fan 13.

What is claimed is:

1. An electric apparatus comprising:
   a casing;
   a power supply accommodated in the casing and comprising:
      a power supply board having a mounting surface; and
      a power supply component mounted on the mounting surface;
   a frame extending in a vertical direction and disposed outward of the power supply within the casing, the frame being formed with a through-hole extending therethrough, the frame having a first part and a second part,
      the through-hole having one open end open to an inner surface of the casing and another open end open to the power supply, the through-hole facing the power supply component in a horizontal direction orthogonal to the vertical direction, the through-hole being surrounded by an ambient portion of the frame,
      the first part being made from a flame retardant resin and constituting at least a part of the ambient portion, the at least a part of the ambient portion being positioned at a side the same as the power supply component with respect to the mounting surface,
      at least a part of the second part being made from a material having flame retardancy lower than that of the flame retardant resin; and
   a fan configured to generate an airflow directed from the power supply to the through-hole.

2. The electric apparatus according to claim 1, wherein the power supply further comprises a cover member covering the power supply board, the cover member having one end portion and another end portion in the horizontal direction, the one end portion being connected to the first part.

3. An image forming apparatus comprising:
   a casing;
   a power supply accommodated in the casing and comprising:
      a power supply board having a mounting surface; and
      a power supply component mounted on the mounting surface;
   a frame extending in a vertical direction and disposed outward of the power supply within the casing, the frame being formed with a through-hole extending therethrough, the frame having a first part and a second part,
      the through-hole having one open end open to an inner surface of the casing and another open end open to the power supply, the through-hole facing the power supply component in a horizontal direction orthogonal to the vertical direction, the through-hole being surrounded by an ambient portion of the frame,
      the first part being made from a flame retardant resin and constituting at least a part of the ambient portion, the at least a part of the ambient portion being positioned at a side the same as the power supply component with respect to the mounting surface,
      at least a part of the second part being made from a material having flame retardancy lower than that of the flame retardant resin;
   a fan configured to generate an airflow directed from the power supply to the through-hole; and
   an image forming unit accommodated in the casing and disposed at a side the same as the power supply with respect to the frame.

4. The image forming apparatus according to claim 3, wherein the power supply further comprises a cover member covering the power supply board, the cover member having one end portion and another end portion in the horizontal direction, the one end portion being connected to the first part.

5. The image forming apparatus according to claim 4, wherein the frame comprises a first frame and a second frame facing the first frame in the horizontal direction,
   wherein the through-hole is formed at the first frame and the first part is positioned at the first frame, and
   wherein the image forming unit and the power supply are disposed between the fist frame and the second frame.

6. The image forming apparatus according to claim 5, wherein the one end portion of the cover member is closer to the first frame than the another end portion of the cover member is to the first frame, the one end portion being connected to the first part of the first frame in the horizontal direction, the another end portion being connected to the second frame in the horizontal direction.

7. The image forming apparatus according to claim 5, wherein the power supply further comprises:
   a primary circuit to which a voltage from an external power supply is inputted;
   a conversion circuit configured to convert the voltage inputted from the external power supply into a predetermined voltage; and
   a secondary circuit configured to output the predetermined voltage to the image forming unit, and
   wherein the primary circuit, the conversion circuit, and the secondary circuit are formed on the power supply board in this order in a direction from the first frame to the second frame.

8. The image forming apparatus according to claim 7, wherein the primary circuit and the fan face each other in the horizontal direction.

9. The image forming apparatus according to claim 3, wherein the first part is formed with a groove extending in a direction orthogonal to the vertical direction and crossing the horizontal direction, and
   wherein the power supply is supported to the first part so as to be slidably movable along the groove.

10. The image forming apparatus according to claim 3, wherein the fan is positioned on an imaginary straight line passing through the power supply and the through-hole, and
   wherein the power supply is supported to at least the first part.

* * * * *